United States Patent
Flemming et al.

(10) Patent No.: US 10,201,091 B2
(45) Date of Patent: *Feb. 5, 2019

(54) PHOTO-DEFINABLE GLASS WITH INTEGRATED ELECTRONICS AND GROUND PLANE

(71) Applicant: 3D GLASS SOLUTIONS, INC., Albuquerque, NM (US)

(72) Inventors: Jeb H. Flemming, Albuquerque, NM (US); Jeff A. Bullington, Albuquerque, NM (US); Roger Cook, Albuquerque, NM (US); Kyle McWethy, Albuquerque, NM (US)

(73) Assignee: 3D Glass Solutions, Inc., Albuquerque, NM (US)

( * ) Notice: Subject to any disclaimer, the term of this patent is extended or adjusted under 35 U.S.C. 154(b) by 0 days.

This patent is subject to a terminal disclaimer.

(21) Appl. No.: 16/116,088

(22) Filed: Aug. 29, 2018

(65) Prior Publication Data

US 2018/0368267 A1  Dec. 20, 2018

Related U.S. Application Data

(63) Continuation of application No. 15/276,363, filed on Sep. 26, 2016, now Pat. No. 10,070,533.
(Continued)

(51) Int. Cl.
*H01L 23/15* (2006.01)
*H05K 3/10* (2006.01)
(Continued)

(52) U.S. Cl.
CPC ............. *H05K 3/107* (2013.01); *H01L 23/15* (2013.01); *H05K 3/0023* (2013.01);
(Continued)

(58) Field of Classification Search
CPC ............. H05K 3/0023; H05K 1/0306; H05K 2201/1003; H01L 23/15; H01L 23/49827; H01L 23/5227; H01L 23/5286
(Continued)

(56) References Cited

U.S. PATENT DOCUMENTS 2,515,940 A    7/1950   Stookey
2,515,941 A    7/1950   Stookey
(Continued)

FOREIGN PATENT DOCUMENTS

CN    1562831 A       4/2004
DE    102004059252 A1  1/2006
(Continued)

OTHER PUBLICATIONS

Aslan, et al, "Metal-Enhanced Fluorescence: an emerging tool in biotechnology" Current opinion in Biotechnology (2005),16:55-62.
(Continued)

*Primary Examiner* — Sherman Ng
(74) *Attorney, Agent, or Firm* — Edwin S. Flores; Chalker Flores, LLP

(57) ABSTRACT

The present invention includes compositions and methods of creating electrical isolation and ground plane structures, around electronic devices (inductors, antenna, resistors, capacitors, transmission lines and transformers) in photo definable glass ceramic substrates in order to prevent parasitic electronic signals, RF signals, differential voltage build up and floating grounds from disrupting and degrading the performance of isolated electronic devices by the fabrication of electrical isolation and ground plane structures on a photo-definable glass substrate.

18 Claims, 2 Drawing Sheets

Related U.S. Application Data

(60) Provisional application No. 62/234,873, filed on Sep. 30, 2015.

(51) Int. Cl.
    *H05K 3/00*       (2006.01)
    *H05K 1/03*       (2006.01)
    *H01L 23/522*     (2006.01)
    *H01L 23/528*     (2006.01)
    *H01L 23/498*     (2006.01)

(52) U.S. Cl.
    CPC .... *H01L 23/49827* (2013.01); *H01L 23/5227* (2013.01); *H01L 23/5286* (2013.01); *H05K 1/0306* (2013.01); *H05K 2201/1003* (2013.01); *H05K 2201/10015* (2013.01); *H05K 2201/10022* (2013.01)

(58) Field of Classification Search
    USPC .......................................................... 174/255
    See application file for complete search history.

(56) References Cited

U.S. PATENT DOCUMENTS

| | | | |
|---|---|---|---|
| 2,628,160 A | 2/1953 | Stookey | |
| 2,684,911 A | 7/1954 | Stookey | |
| 2,971,853 A | 2/1961 | Stookey | |
| 3,985,531 A | 10/1976 | Grossman | |
| 3,993,401 A | 11/1976 | Strehlow | |
| 4,514,053 A | 4/1985 | Borrelli et al. | |
| 4,788,165 A | 11/1988 | Fong et al. | |
| 5,078,771 A | 1/1992 | Wu | |
| 5,212,120 A | 5/1993 | Araujo et al. | |
| 5,374,291 A | 12/1994 | Yabe et al. | |
| 5,395,498 A | 3/1995 | Gombinsky et al. | |
| 5,733,370 A | 3/1998 | Chen et al. | |
| 5,850,623 A | 12/1998 | Carman, Jr. et al. | |
| 5,919,607 A | 7/1999 | Lawandy et al. | |
| 5,998,224 A | 12/1999 | Rohr et al. | |
| 6,066,448 A | 5/2000 | Wohlstadter et al. | |
| 6,094,336 A | 7/2000 | Weekamp | |
| 6,136,210 A | 10/2000 | Biegelsen et al. | |
| 6,287,965 B1 | 9/2001 | Kang et al. | |
| 6,329,702 B1 * | 12/2001 | Gresham | H01L 21/486 |
| | | | 257/623 |
| 6,383,566 B1 | 5/2002 | Zagdoun | |
| 6,485,690 B1 | 11/2002 | Pfost et al. | |
| 6,678,453 B2 | 1/2004 | Bellman et al. | |
| 6,783,920 B2 | 8/2004 | Livingston et al. | |
| 6,824,974 B2 | 11/2004 | Pisharody et al. | |
| 6,843,902 B1 | 1/2005 | Penner et al. | |
| 6,875,544 B1 | 4/2005 | Sweatt et al. | |
| 6,932,933 B2 | 8/2005 | Helvajian et al. | |
| 6,977,722 B2 | 12/2005 | Wohlstadter et al. | |
| 7,033,821 B2 | 4/2006 | Kim et al. | |
| 7,132,054 B1 | 11/2006 | Kravitz et al. | |
| 7,179,638 B2 | 2/2007 | Anderson | |
| 7,306,689 B2 | 12/2007 | Okubora et al. | |
| 7,326,538 B2 | 2/2008 | Pitner et al. | |
| 7,407,768 B2 | 8/2008 | Yamazaki et al. | |
| 7,410,763 B2 | 8/2008 | Su et al. | |
| 7,470,518 B2 | 12/2008 | Chiu et al. | |
| 7,497,554 B2 | 3/2009 | Okuno | |
| 7,603,772 B2 | 10/2009 | Farnworth et al. | |
| 8,062,753 B2 | 11/2011 | Schreder et al. | |
| 8,076,162 B2 | 12/2011 | Flemming et al. | |
| 8,096,147 B2 | 1/2012 | Flemming et al. | |
| 8,361,333 B2 | 1/2013 | Flemming et al. | |
| 8,492,315 B2 | 7/2013 | Flemming et al. | |
| 8,709,702 B2 | 4/2014 | Flemming et al. | |
| 2002/0086246 A1 | 7/2002 | Lee | |
| 2002/0110942 A1 * | 8/2002 | Moghe | H01L 23/66 |
| | | | 438/26 |
| 2003/0025227 A1 | 2/2003 | Daniell | |
| 2003/0124716 A1 | 7/2003 | Hess et al. | |
| 2003/0135201 A1 | 7/2003 | Gonnelli | |
| 2003/0156819 A1 | 8/2003 | Pruss et al. | |
| 2003/0228682 A1 | 12/2003 | Lakowicz et al. | |
| 2004/0008391 A1 | 1/2004 | Bowley et al. | |
| 2004/0020690 A1 | 2/2004 | Parker et al. | |
| 2004/0171076 A1 | 9/2004 | Dejneka et al. | |
| 2004/0198582 A1 | 10/2004 | Borrelli et al. | |
| 2005/0089901 A1 | 4/2005 | Porter et al. | |
| 2005/0170670 A1 | 8/2005 | King et al. | |
| 2006/0147344 A1 | 7/2006 | Ahn et al. | |
| 2006/0159916 A1 | 7/2006 | Dubrow et al. | |
| 2006/0177855 A1 | 8/2006 | Utermohlen et al. | |
| 2006/0188907 A1 | 8/2006 | Lee et al. | |
| 2007/0120263 A1 | 5/2007 | Gabric et al. | |
| 2007/0121263 A1 | 5/2007 | Liu et al. | |
| 2007/0155021 A1 | 7/2007 | Zhang et al. | |
| 2008/0136572 A1 | 6/2008 | Ayasi et al. | |
| 2008/0174976 A1 | 7/2008 | Satoh et al. | |
| 2008/0182079 A1 | 7/2008 | Mirkin et al. | |
| 2008/0291442 A1 | 11/2008 | Lawandy | |
| 2009/0130736 A1 | 5/2009 | Collis et al. | |
| 2009/0182720 A1 | 7/2009 | Cain et al. | |
| 2010/0022416 A1 | 1/2010 | Flemming et al. | |
| 2011/0003422 A1 | 1/2011 | Katragadda et al. | |
| 2011/0065662 A1 | 3/2011 | Rinsch et al. | |
| 2011/0170273 A1 | 7/2011 | Helvajian | |
| 2011/0217657 A1 | 9/2011 | Flemming et al. | |
| 2011/0284725 A1 | 11/2011 | Goldberg | |
| 2012/0314384 A1 * | 12/2012 | Woychik | H01L 21/76898 |
| | | | 361/752 |
| 2013/0142998 A1 | 6/2013 | Flemming et al. | |
| 2014/0070380 A1 * | 3/2014 | Chiu | H01L 23/5381 |
| | | | 257/666 |
| 2014/0104284 A1 | 4/2014 | Shenoy et al. | |
| 2015/0277047 A1 | 10/2015 | Flemming et al. | |
| 2017/0003421 A1 | 1/2017 | Flemming et al. | |
| 2017/0098501 A1 | 4/2017 | Flemming et al. | |

FOREIGN PATENT DOCUMENTS

| | | |
|---|---|---|
| EP | 0311274 A2 | 12/1989 |
| EP | 1683571 A1 | 6/2006 |
| JP | 2000228615 A | 8/2000 |
| JP | H08026767 A | 1/2016 |
| KR | 101167691 B1 | 7/2012 |
| WO | 2008119080 A1 | 10/2008 |
| WO | 2008154931 A2 | 12/2008 |
| WO | 2009029733 A2 | 3/2009 |
| WO | 2009062011 A1 | 5/2009 |
| WO | 2009126649 A2 | 10/2009 |
| WO | 2010011939 A2 | 1/2010 |
| WO | 2011100445 A1 | 8/2011 |
| WO | 2014043267 A1 | 3/2014 |
| WO | 2015112903 A1 | 7/2015 |
| WO | 2015171597 A1 | 11/2015 |
| WO | 2017132280 A2 | 8/2017 |
| WO | 2017147511 A1 | 8/2017 |
| WO | 2017177171 A1 | 10/2017 |

OTHER PUBLICATIONS

Bakir, Muhannad S., et al., "Revolutionary Nanosilicon Ancillary Technologies for Ultimate-Performance Gigascale Systems," IEEE 2007 Custom Integrated Circuits Conference (CICC), 2007, pp. 421-428.

Beke, S., et al., "Fabrication of Transparent and Conductive Microdevices," Journal of Laser Micro/Nanoengineering (2012), 7(1):28-32.

Brusberg, et al. "Thin Glass Based Packaging Technologies for Optoelectronic Modules" Electronic Components and Technology Conference, May 26-29, 2009, pp. 207-212, DOI:10.1109/ECTC.2009.5074018, pp. 208-211; Figures 3, 8.

Cheng, et al. "Three-dimensional Femtosecond Laser Integration in Glasses" The Review of Laser Engineering, vol. 36, 2008, pp. 1206-1209, Section 2, Subsection 3.1.

(56) References Cited

OTHER PUBLICATIONS

Chowdhury, et al, "Metal-Enhanced Chemiluminescence", J Fluorescence (2006), 16:295-299.
Crawford, Gregory R, "Flexible Flat Panel Display Technology," John Wiley and Sons, NY, (2005), 9 pages.
Dang, et al. "Integrated thermal-fluidic I/O interconnects for an on-chip microchannel heat sink," IEEE Electron Device Letters, vol. 27, No. 2, pp. 117-119, 2006.
Dietrich, T.R., et al., "Fabrication Technologies for Microsystems Utilizing Photoetchable Glass," Microelectronic Engineering 30, (1996), pp. 407-504.
Extended European Search Report 157410325 dated Aug. 4, 2017, 11 pp.
Extended European Search Report 15789595A dated Mar. 31, 2017, 7 pp.
Geddes, et al, "Metal-Enhanced Fluorescence" J Fluorescence, (2002), 12:121-129.
Gomez-Morilla, et al. "Micropatterning of Foturan photosensitive glass following exposure to MeV proton beams" Journal of Micromechanics and Microengineering, vol. 15, 2005, pp. 706-709, DOI:10.1088/0960-1317/15/4/006.
Intel Corporation, "Intel® 82566 Layout Checklist (version 1.0)", 2006.
International Search Report and Written Opinion for PCT/US2008/058783 dated Jul. 1, 2008, 15 pp.
International Search Report and Written Opinion for PCT/US2008/074699 dated Feb. 26, 2009, 11 pp.
International Search Report and Written Opinion for PCT/US2009/039807 dated Nov. 24, 2009, 13 pp.
International Search Report and Written Opinion for PCT/US2009/051711 dated Mar. 5, 2010, 15 pp.
International Search Report and Written Opinion for PCT/US2011/024369 dated Mar. 25, 2011, 13 pp.
International Search Report and Written Opinion for PCT/US2013/059305 dated Jan. 10, 2014, 6 pp.
International Search Report and Written Opinion for PCT/US2015/012758 dated Apr. 8, 2015, 11 pp.
International Search Report and Written Opinion for PCT/US2015/029222 dated Jul. 22, 2015, 9 pp.
International Search Report and Written Opinion for PCT/US2017/019483 dated May 19, 2017, 11 pp.
International Search Report and Written Opinion for PCT/US2017/026662 dated Jun. 5, 2017, 11 pp.
International Technology Roadmap for Semiconductors, 2007 Edition, "Assembly and Packaging," 9 pages.
Lakowicz, et al; "Advances in Surface-Enhanced Fluorescence", J Fluorescence, (2004), 14:425-441.
Lewis, Sr., "Hawley's Condensed Chemical Dictionary." 13th ed, 1997, John Wiley and Sons. p. 231.
Lin, C.H., et al., "Fabrication of Microlens Arrays in Photosensitive Glass by Femtosecond Laser Direct Writing," Appl Phys A (2009) 97:751-757.
Livingston, F.E., et al., "Effect of Laser Parameters on the Exposure and Selective Etch Rate in Photostructurable Glass," SPIE vol. 4637 (2002); pp. 404-412.
Lyon, L.A., et al., "Raman Spectroscopy," Anal Chem (1998), 70:341R-361R.
Perro, A., et al., "Design and synthesis of Janus micro- and nanoparticles," J Mater Chem (2005), 15:3745-3760.
Quantum Leap, "Liquid Crystal Polymer (LCP) LDMOS Packages," Quantum Leap Datasheet, (2004), mlconnelly.com/QLPKG.Final_LDMOS_DataSheet.pdf, 2 pages.
Scrantom, Charles Q., "LTCC Technology—Where We Are and Where We're Going—IV," Jun. 2000, 12 pages.
TechNote #104, Bangs Laboratories, www.bangslabs.com/technotes/104.pdf, "Silica Microspheres".
TechNote #201, Bangs Laboratories, www.bangslabs.com/technotes/201.pdf, "Working with Microspheres".
TechNote #205, Bangs Laboratories, www.bangslabs.com/technotes/205.pdf, "Covalent Coupling".
Wang, et al. "Optical waveguide fabrication and integration with a micro-mirror inside photosensitive glass by femtosecond laser direct writing" Applied Physics A, vol. 88, 2007, pp. 699-704, DOI:10.1007/S00339-007-4030-9.
Zhang, H., et al., "Biofunctionalized Nanoarrays of Inorganic Structures Prepared by Dip-Pen Nanolithography," Nanotechnology (2003), 14:1113-1117.
Zhang, H., et al., Synthesis of Hierarchically Porous Silica and Metal Oxide Beads Using Emulsion-Templated Polymer Scaffolds, Chem Mater (2004), 16:4245-4256.

* cited by examiner

PHOTO-DEFINABLE GLASS WITH INTEGRATED ELECTRONICS AND GROUND PLANE

CROSS-REFERENCE TO RELATED APPLICATIONS

This is a Continuation Patent Application claims priority to U.S. Ser. No. 15/276,363, filed on Sep. 26, 2016, now U.S. Pat. No. 10,070,533, issuing Sep. 4, 2018, which claims benefit to Provisional Patent Application Ser. No. 62/234,873, filed Sep. 30, 2015, the contents of which is incorporated by reference herein in its entirety.

TECHNICAL FIELD OF THE INVENTION

The present invention relates to creating electrical isolation and ground plane structures, around electronic devices (Inductors, Antenna, Resistors, Transmission Lines and Transformers) in photo-definable glass ceramic substrates in order to prevent parasitic electronic signals, RF signals, differential voltage build up and floating grounds from disrupting and degrading the performance of isolated electronic devices by the fabrication of electrical isolation and ground plane structures on a photo-definable glass substrate.

STATEMENT OF FEDERALLY FUNDED RESEARCH

None.

INCORPORATION-BY-REFERENCE OF MATERIALS FILED ON COMPACT DISC

None.

BACKGROUND OF THE INVENTION

Photo-definable glass structures have been suggested for a number of micromachining and microfabrication processes such as integrated electronic elements in conjunction with other elements systems or subsystems. Semiconductor microfabrication of traditional glass is expensive and low yield while injection modeling or embossing processes produce inconsistent shapes. Semiconductor microfabrication processes rely on expensive capital equipment; photo-lithography and reactive ion etching or ion beam milling tools that generally cost in excess of one million dollars each and require an ultra-clean, high-production silicon fabrication facility costing millions to billions more. This invention provides creates a cost effective glass ceramic electronic individual device or as an array of devices with an integrated ground plane and/or RF isolation.

SUMMARY OF THE INVENTION

The present invention includes a method to fabricate a substrate with one or more, electronic devices with and integrated ground plane and/or RF isolation structure by preparing a photo-definable glass substrate. Where the electronic devices are adjacent to above or bellow the ground plane, RF isolation structures and structures with coatings or filling of one or more, metals, dielectrics or composite materials.

A method of fabrication of electronic devices with integrated ground planes and/or RF isolation structures is made by preparing a photo-definable glass ceramic composite substrate comprising at least silica, lithium oxide, aluminum oxide, and cerium oxide, masking a design layout comprising one or more, electronic device and integrated ground plane and/or RF isolation structure in the photo-definable glass substrate. Then exposing at least one portion of the photo-definable glass substrate to an activating energy source, exposing the photo-definable glass substrate to a heating phase of at least ten minutes above its glass transition temperature, cooling the photo-definable glass substrate to transform at least part of the exposed glass to a crystalline material to form a glass-crystalline substrate and etching the glass-crystalline substrate with an etchant solution to form one or more angled channels or through holes that are then used in the inductive device.

The present invention provides an ground plane and/or RF isolation structure on a substrate comprising a photo-definable glass substrate having a top surface comprising an electronic device and a bottom surface, one or more through glass via (TGV) that extends from the top surface to the bottom surface; a top grounded metal that extends around the electronic device on the top surface; and a bottom grounded metal that extends around the electronic device on the bottom surface; and a ground plane structure separated from and electronically connected by the one or more TGV.

The photo-definable glass substrate may be a photo-definable glass wafer. The device may further comprising a low resistive material that circumscribes photo-definable glass substrate. The top surface may be connected to an electronic isolation structure on the bottom surface of the photo-definable glass substrate through a metallized filled TGV. The electronic isolation structure on the bottom surface may be a mirrored image of the isolation structure on the top surface. The ground plane and/or RF isolation structure may be electrically connected, mechanically connected or both to a ground plane. The electrical and mechanical connection may be a solder bump. The photo-definable glass substrate comprises: 60-76 weight % silica, 6 weight %-16 weight % of a combination of $K_2O$ and $Na_2O$ with at least 3 weight % $K_2O$, 0.001-1 weight % $Ag_2O$, 0.75 weight %-7 weight % $B_2O_3$, and 5-8 weight % $Al_2O_3$, wherein the combination of $B_2O_3$, and $Al_2O_3$ not exceeding 13 weight %, 8-15 weight % $Li_2O$, and 0.04-0.1 weight % $CeO_2$.

The present invention provides a method of creating a ground plane and/or RF isolation device created in or on photo-definable glass by providing a photo-definable glass substrate; masking a design layout on the photo-definable glass substrate to form a masked design layout, wherein the design layout comprises one or more structures that form one or more electrical conduction paths; exposing at least one portion of the masked design layout to an activating energy source; exposing the photo-definable glass substrate to a heating phase for at least ten minutes above its glass transition temperature to form an exposed glass substrate; cooling the photo-definable glass substrate; transforming at least part of the exposed glass substrate to a crystalline material to form a glass-crystalline substrate; etching the glass-crystalline substrate with an etchant solution to form the one or more angled channels; converting the glass-crystalline substrate adjacent to the one or more angled channels to a ceramic phase; coating the one or more angled channels with one or more metals; coating at least a portion of the electrical isolation structure with a metallic media; and connecting the metallic media, the one or more metals or both to a circuitry through a surface or buried contact.

The one or more metals may reside partially through, fully through, or on top of the glass-ceramic material or a combination thereof. The photo-definable glass substrate comprises: 60-76 weight % silica, 6 weight %-16 weight % of a combination of $K_2O$ and $Na_2O$ with at least 3 weight % $K_2O$, 0.001-1 weight % $Ag_2O$, 0.75 weight %-7 weight % $B_2O_3$, and 5-8 weight % $Al_2O_3$, wherein the combination of $B_2O_3$, and $Al_2O_3$ not exceeding 13 weight %, weight % $Li_2O$, and 0.04-0.1 weight % $CeO_2$. The photo-definable glass substrate may be essentially germanium-free. The photo-definable glass substrate comprises at least 0.5 weight % $B_2O_3$. The photo-definable glass substrate comprises at least 1.25 weight % $B_2O_3$.

The photo-definable glass substrate comprises at least 0.3 weight % $Sb_2O_3$ or $As_2O_3$. The photo-definable glass substrate comprises 0.003-1 weight % $Au_2O$. The photo-definable glass substrate comprises 1-18 weight % of an oxide selected from the group consisting of CaO, ZnO, PbO, MgO and BaO. The anisotropic-etch ratio of exposed portion to said unexposed portion is at least one of 10-20:1; 21-29:1; 30-45:1; 20-40:1; 41-45:1; and 30-50:1. The etchant may be hydrofluoric acid. The activating energy source may be an ultraviolet light having a wavelength of about 308-312 nm.

BRIEF DESCRIPTION OF THE DRAWINGS

For a more complete understanding of the features and advantages of the present invention, reference is now made to the detailed description of the invention along with the accompanying figures and in which.

DETAILED DESCRIPTION OF THE INVENTION

Figure 1A:
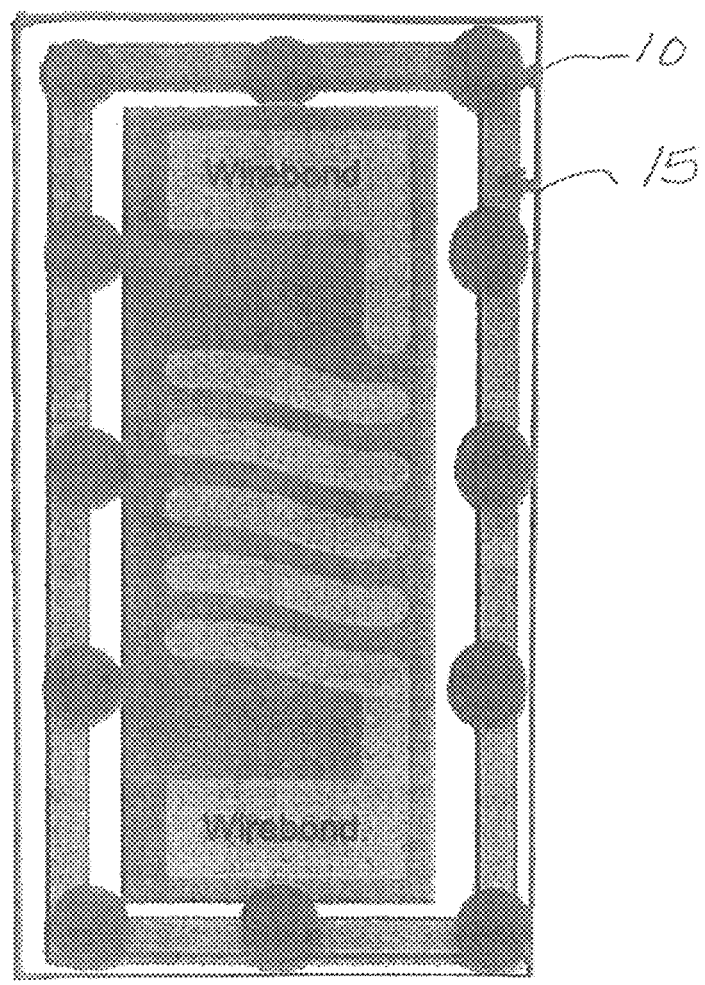
FIG. 1A is a top view of a schematic illustrating a coreless inductor with an integrated ground plane for electronic shielding.

While the making and using of various embodiments of the present invention are discussed in detail below, it should be appreciated that the present invention provides many applicable inventive concepts that can be embodied in a wide variety of specific contexts. The specific embodiments discussed herein are merely illustrative of specific ways to make and use the invention and do not delimit the scope of the invention.

To facilitate the understanding of this invention, a number of terms are defined below. Terms defined herein have meanings as commonly understood by a person of ordinary skill in the areas relevant to the present invention. Terms such as "a", "an" and "the" are not intended to refer to only a singular entity, but include the general class of which a specific example may be used for illustration. The terminology herein is used to describe specific embodiments of the invention, but their usage does not delimit the invention, except as outlined in the claims.

An embedded ground plane with insulated vias and methods for fabricating same are disclosed. In the following detailed specification, numerous specific details are set forth, such as thicknesses, materials, etc., in order to provide a thorough understanding of the present invention. It will, however, be obvious to one skilled in the art that the present invention may be practiced without specific details. In other instances, well known processing steps and well known device structures have not been described in detail in order not to unnecessarily obscure the present invention. The reader will further note that the present invention may be embodied within microelectronic circuits (microchips), large multichip modules (MCM), or other circuits boards/structures that require ground planes and use vias.

As used herein the term FOTURAN® is described in information supplied by Invenios (the sole source U.S. supplier for FOTURAN®) is composed of silicon oxide $(SiO_2)$ of 75-85% by weight, lithium oxide $(Li_2O)$ of 7-11% by weight, aluminum oxide $(Al_2O_3)$ of 3-6% by weight, sodium oxide $(Na_2O)$ of 1-2% by weight, 0.2-0.5% by weight antimonium trioxide $(Sb_2O_3)$ or arsenic oxide $(As_2O_3)$, silver oxide $(Ag_2O)$ of 0.05-0.15% by weight, and cerium oxide $(CeO_2)$ of 0.01-0.04% by weight.

As used herein the term "APEX glass" or simply "APEX" is used to denote one embodiment of the composition of the present invention. Surprisingly, it was found that the compositions of the present invention may appear to be similar to FOTURAN®, however, the compositions of the present invention demonstrated a surprising sensitivity to ultraviolet light exposure of over three times that of the commercially available photosensitive glass, and yielded up to six times the etch rate more compared to FOTURAN® when both compositions were processed in the way recommended for FOTURAN® (with the exception of the reduced exposure and bake temperature used for APEX due to its greater sensitivity and lower glass transformation temperature). Further, APEX glass had an etch ratio of exposed portion to that of the unexposed portion of at least 30:1 to 40:1, while the best reported etch ratio of the commercially available FOTURAN® photosensitive glass exposed with a broad spectrum mid-ultraviolet flood lamp is about 20:1.

To address these needs, the present inventors use a photo-definable glass ceramic (APEX®) Glass Ceramic or other photo-definable glass as a novel substrate material for semiconductors, RF electronics, microwave electronics, electronic components and/or optical elements. In general, a photo-definable glass is processed using first generation semiconductor equipment in a simple three step process and the final material can be fashioned into either glass, ceramic, or contain regions of both glass and ceramic. A photo-definable glass ceramic possesses several benefits over current materials, including: easily fabricated high density vias, demonstrated microfluidic capability, micro-lens or micro-lens array, transformers, inductors transmission lines, and many other devices. Photo-definable glasses have several advantages for the fabrication of a wide variety of microsystems components. Microstructures have been produced relatively inexpensively with these glasses using conventional semiconductor or PC board processing equipment. In general, glasses have high temperature stability, good mechanical and electrical properties, and have better chemical resistance than plastics and many metals. Another form of photo-definable glass is FOTURAN®, made by Schott Corporation. FOTURAN® comprises a lithium-aluminum-silicate glass containing traces of silver ions plus other trace elements specifically silicon oxide $(SiO_2)$ of 75-85% by weight, lithium oxide $(Li_2O)$ of 7-11% by weight, aluminum oxide $(Al_2O_3)$ of 3-6% by weight, sodium oxide $(Na_2O)$ of 1-2% by weight, 0.2-0.5% by weight antimonium trioxide $(Sb_2O_3)$ or arsenic oxide $(As_2O_3)$, silver oxide $(Ag_2O)$ of 0.05-0.15% by weight, and cerium oxide $(CeO_2)$ of 0.01-0.04% by weight.

When exposed to UV-light within the absorption band of cerium oxide, the cerium oxide acts as sensitizers, absorbing a photon and losing an electron that reduces neighboring silver oxide to form silver atoms, e.g.,

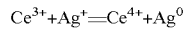

The silver atoms coalesce into silver nanoclusters during the baking process and induce nucleation sites for crystallization of the surrounding glass. If exposed to UV light through a mask, only the exposed regions of the glass will crystallize during subsequent heat treatment.

This heat treatment must be performed at a temperature near the glass transformation temperature (e.g., greater than 465° C. in air for FOTURAN®). The crystalline phase is more soluble in etchants, such as hydrofluoric acid (HF), than the unexposed vitreous, amorphous regions. In particular, the crystalline regions of FOTURAN® are etched about 20 times faster than the amorphous regions in 10% HF, enabling microstructures with wall slopes ratios of about 20:1 when the exposed regions are removed. See T. R. Dietrich et al., "Fabrication technologies for microsystems utilizing photo-definable glass," Microelectronic Engineering 30, 497 (1996), which is incorporated herein by reference.

Preferably, the shaped glass structure contains at least one or more, two or three-dimensional electronic device where the perimeter of the device is enclosed with a metallic ground plan. The patterned regions of the photo-definable glass can be filled with metal, alloys, composites, glass or magnetic media, by a number of methods including ink jetting, stylist, paste, plating or vapor phase deposition to create electronic devices structures surrounded by a ground plane. Traditional ground planes in electronics and semiconductor are on the same plane as the electronic/semiconductor device. These ground planes are used to provide electronic shielding for the electronic devices and a distribute ground for different electronic potentials occurring across the circuit. Most electrical circuits have a common ground that is electrically connected to the Earth, hence the term "ground". Without this connection the ground is said to be floating allowing different electrical potentials to build up on different electronic devices. Different electronic potentials can occur across the circuit from a phenomenon often referred to as a floating ground. The different voltage potentials can disrupt or distort the function of the electronic device. Additionally the electronic devices are subject to the effects of the buildup of electronic potential from electronic noise and or parasitic signals from surrounding electronic device on the same substrate or connected by a conductor or from RF/Microwave signals not connected to the electronic device.

Conductors are also described as having a floating voltage if they are not connected electrically to another non-floating conductor. Without such a connection voltage and current flows are induced by electromagnetic fields or charge accumulation within the conductor rather than being due to the usual external potential difference of a power source.

As the electronic device structures in the photo-definable glass can be three dimensional the ground plane for these three dimensional electronic devices structures require a three dimensional ground plane.

Generally, glass ceramics materials have had limited success in microstructure formation plagued by performance, uniformity, usability by others and availability issues. The present invention includes a method for fabricating a glass ceramic structure for use in forming inductive structures used in electromagnetic transmission, transformers and filtering applications. The present invention includes an inductive structures created in the multiple planes of a glass-ceramic substrate, such process employing the (a) exposure to excitation energy such that the exposure occurs at various angles by either altering the orientation of the substrate or of the energy source, (b) a bake step and (c) an etch step. Angle sizes can be either acute or obtuse. The curved and digital structures are difficult, if not infeasible, to create in most glass, ceramic or silicon substrates. The present invention has created the capability to create structures in both the vertical as well as horizontal plane for glass-ceramic substrates. The present invention includes a method for fabricating of an inductive structure on or in a glass ceramic.

Ceramicization of the glass is accomplished by exposing the entire glass substrate to approximately 20 J/cm$^2$ of 310 nm light. When trying to create glass spaces within the ceramic, users expose all of the material, except where the glass is to remain glass. In one embodiment, the present invention provides a quartz/chrome mask containing a variety of concentric circles with different diameters.

The exposed portion may be transformed into a crystalline material by heating the glass substrate to a temperature near the glass transformation temperature. When etching the glass substrate in an etchant such as hydrofluoric acid, the anisotropic-etch when the glass is exposed to a broad spectrum mid-ultraviolet (about 308-312 nm) flood lamp to provide a shaped glass structure to create an inductive structure. The mask for the exposure can be of a halftone mask that provides a continuous grey scale to the exposure to form a curved structure for the creation of an inductive structure/device. A digital mask can also be used with the flood exposure and can be used to produce the creation an inductive structure/device. The exposed glass is then baked typically in a two-step process. Temperature range heated between of 420° C.-520° C. for between 10 minutes to 2 hours, for the coalescing of silver ions into silver nanoparticles and temperature range heated between 520° C.-620° C. for between 10 minutes and 2 hours allowing the lithium oxide to form around the silver nanoparticles. The glass plate is then etched. The glass substrate is etched in an etchant, of HF solution, typically 5% to 10% by volume. The ground plane and/or RF isolation structure is created creating by:

First creating a series of vias by etching the photo-definable glass completely or partly through the thickness of the glass wafer.

The vias are then filled with a metal by paste, vapor phase or other deposition process.

A metal pattern is created by a vapor phase deposition and a lift off deposition process or pasted through a screen printing process on or in the surface of the photo-definable glass connects via Metal pattern on or in the surface of the photo-definable glass that circumscribe the perimeter of the electronic devices to be isolated. The ground plane and/or RF isolation structure is created on a series of metal filled vias.

The electronic structure in the photo-definable glass may be susceptible to parasitic RF and electronic signals and floating grounds from all axes that may require a mirrored structure on the bottom of the photo-definable glass to provide adequate isolation.

The mirrored ground plane and/or RF isolation structure is connected to the electronic packaging ground by solder balls, ball grid array or other technique.

The ground plane and/or RF isolation structure provide a greater level of performance that is electronically quieter with a significant enhancement of the signal-to-noise ratio, lower electrical losses and higher Q factor. These attributes make for high quality electronics with higher efficiency and smaller size.

FIG. 1A is a top view of a schematic illustrating a coreless inductor with an integrated ground plane for electronic shielding. The schematic includes a Through Glass Via (TGV) inductor 10 with top grounded metal 15 around the TGV inductor 10 on the top surface (as shown) and also on the bottom surface (not shown).

Figure 1B:
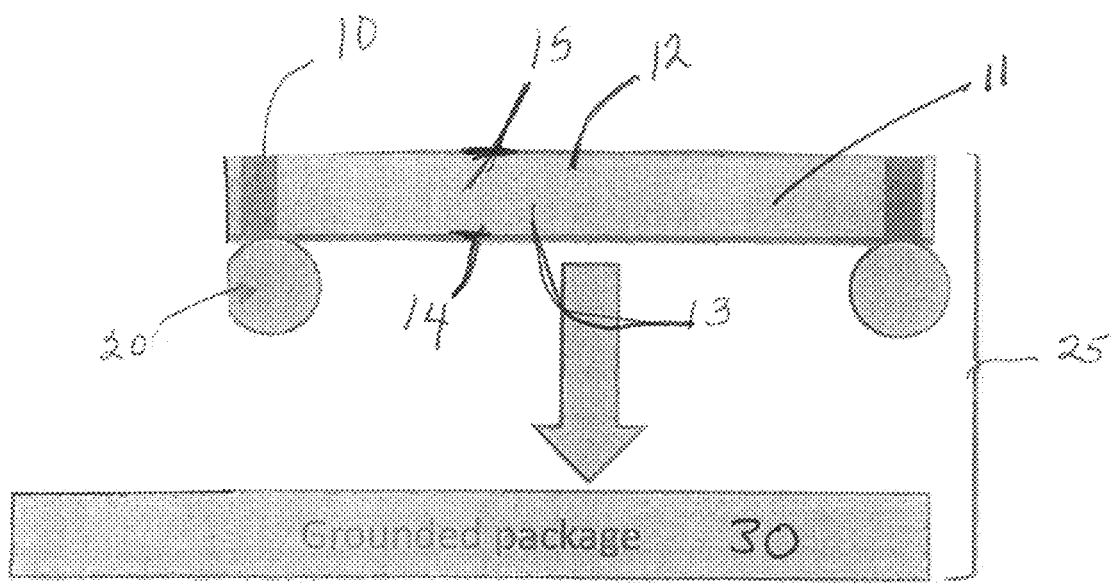
FIG. 1B is a side view of a schematic illustrating the coreless inductor with an integrated ground plane for electronic shielding as seen in FIG. 1A.

FIG. 1B is a side view of a schematic illustrating the coreless inductor with an integrated ground plane for electronic shielding as seen in FIG. 1A. The substrate 11 includes the TGV inductor 10 that goes from the top surface 12 to the bottom surface 13. The top grounded metal 15 extends around the TGV inductor 10 on the top surface 12. The bottom grounded metal 14 extends around the TGV inductor 10 on the bottom surface 13. The substrate 11 is in communication with ground package 30 and ground 25. In addition the substrate 11 includes a solder ball 20 or other structure that provides a standoff between the TGV inductor 10 and the ground package 30.

General Photoactive Glass Manufacturing Design Rules: Boron Oxide and Aluminum oxide basically conduct the same task within the glass melt. Boron oxide may also be in the form of anhydride boric acid ($H_3BO_3$), Borax Frits, Gerstley Borate/Colemanite, Boric Acid, Borax, and Ulexite. A 13 weight % represents the high end of $B_2O_3$ in borosilicate glasses. Boron Oxide concentration range: Up to 13 weight %. Aluminum oxide may be in the form of Alkali containing feldspars (such as Albite, $NaAlSi_3O_8$) or alumina hydrate. $Al_2O_3$ may be added by using kaolin or nepheline syenite (which contains feldspar). Up to 8 weight %. This represents the high end of $Al_2O_3$ in borosilicate glasses.crystallization Aluminum Oxide concentration range: up to 7 weight %. Or more appropriately, the combination of Boron Oxide and Aluminum Oxide should not exceed 13 weight %. Potassium Oxide and Sodium Oxide basically conduct the same task within the glass melt. Potassium oxide: Helps lower melting point. Sometimes used to replace sodium in soda lime glasses. Range up to 16 weight % as well. May also be Potash ($K_2CO_3$). If used to replace $Na_2O$, typically makes the glass more chemically resistant. Potassium Oxide concentration range: up to 16 weight %. Sodium oxide helps lower melting point. Range up to 16 weight % (common high end for soda lime glass). May also be soda ash ($Na_2CO_3$) or Glauber's Salt ($Na_2SO_4$). Sodium oxide concentration range: up to 16 weight %. Or more appropriately, the combination of these two should not exceed 16 weight %. Silica: concentration range: 60-85 weight %. Zinc oxide: Improves chemical resistance, lowers thermal expansion, adds elasticity. Works similarly with CaO. Up to 18 weight % in E-Glass. Zinc Oxide concentration range: up to 18 weight %. Lithium Oxide: Aids in nucleation. Can be lithium carbonate. Lithium Oxide concentration range: 8-15 weight %. Cerium Oxide: Electron Donor. Cerium oxide concentration range: up to 0.1 weight %. Antimonium trioxide: Oxygen donor. Antimonium trioxide ($Sb_2O_3$) concentration range: up to 0.5 weight %. Arsenic Oxide: Oxygen donor. Arsenic oxide ($As_2O_3$): Electron Donor. Arsenic Oxide concentration range: up to 0.1 weight. Silver Oxide concentration range: up to 1 weight %. Gold Oxide concentration range: up to 1 weight %. Copper Oxide concentration range: up to 2 weight %. The above ingredients might be at least partially replaced with the following compounds: Calcium Oxide: Improves chemical resistance, lowers thermal expansion, adds elasticity. Works similarly with ZnO. Up to 18 weight % in E-Glass. Calcium Oxide concentration range: up to 18 weight %. Magnesium Oxide: This is the upper end in E-glass. May be in the form of $MgCO_3$. Magnesium oxide concentrate range: up to 10 weight %. Barium Oxide: Improves refractive index of the material without increasing the dispersive power. Used as a replacement for lead or lime. May also come in the form of $BaCO_3$. Barium Oxide concentration range: up to 18 weight %. Lead Oxide: Improves refractive index of the material without increasing the dispersive power. Lead Oxide concentration range: up to 18 weight %. Iron may be added to the melt to make the material paramagnetic (e.g. $Fe_2O_3$). Iron oxide may additionally be used to quench intrinsic autofluorescence of other compounds within the glass. Iron Oxide Concentration range: up to 5 weight %.

Processing parameters. Patterning of the selected area(s) by at least one process step selected from the group consisting of: Exposing the glass substrate to an activating energy source, such as 310 nm light or a directed source of protons. High anisotropic-etch ratios may be obtained using the photoactive glass of the present invention using a total activation energy between 0.4 $J/cm^2$ and 4 $J/cm^2$ of 310 nm light. In contrast, FOTURAN® sometimes requires up to 54 $J/cm^2$ activation energy to create a uniform exposure across large distances (i.e., inches). Baking typically occurs in a two-step process. Temperature 1 allows for the coalescing of silver ions into silver nanoparticles and temperature 2 allows for the lithium oxide to form around the silver nanoparticles. However, we have been successful in doing a single ramp step. Etching is done in an HF solution, typically 5-10% by volume. However, we can also add other fluids to the etch solution. For example, we can add hydrochloric or nitric acid to the etch solution. We've had good success in using this solution to obtain a smoother etch because it dissolves the silver nanoparticles.

Although the present invention and its advantages have been described in detail, it should be understood that various changes, substitutions and alterations can be made herein without departing from the spirit and scope of the invention as defined by the appended claims. Moreover, the scope of the present application is not intended to be limited to the particular embodiments of the process, machine, manufacture, composition of matter, means, methods and steps described in the specification. As one of ordinary skill in the art will readily appreciate from the disclosure of the present invention, processes, machines, manufacture, compositions of matter, means, methods, or steps, presently existing or later to be developed, that perform substantially the same function or achieve substantially the same result as the corresponding embodiments described herein may be utilized according to the present invention. Accordingly, the appended claims are intended to include within their scope such processes, machines, manufacture, compositions of matter, means, methods, or steps.

All publications and patent applications mentioned in the specification are indicative of the level of skill of those skilled in the art to which this invention pertains. All publications and patent applications are herein incorporated by reference to the same extent as if each individual publication or patent application was specifically and individually indicated to be incorporated by reference.

The use of the word "a" or "an" when used in conjunction with the term "comprising" in the claims and/or the specification may mean "one," but it is also consistent with the meaning of "one or more," "at least one," and "one or more than one." The use of the term "or" in the claims is used to mean "and/or" unless explicitly indicated to refer to alternatives only or the alternatives are mutually exclusive, although the disclosure supports a definition that refers to only alternatives and "and/or." Throughout this application, the term "about" is used to indicate that a value includes the inherent variation of error for the device, the method being employed to determine the value, or the variation that exists among the study subjects.

As used in this specification and claim(s), the words "comprising" (and any form of comprising, such as "comprise" and "comprises"), "having" (and any form of having, such as "have" and "has"), "including" (and any form of including, such as "includes" and "include") or "containing" (and any form of containing, such as "contains" and "contain") are inclusive or open-ended and do not exclude additional, unrecited elements or method steps.

The term "or combinations thereof" as used herein refers to all permutations and combinations of the listed items preceding the term. For example, "A, B, C, or combinations thereof" is intended to include at least one of: A, B, C, AB, AC, BC, or ABC, and if order is important in a particular context, also BA, CA, CB, CBA, BCA, ACB, BAC, or CAB. Continuing with this example, expressly included are combinations that contain repeats of one or more item or term, such as BB, AAA, MB, BBC, AAABCCCC, CBBAAA, CABABB, and so forth. The skilled artisan will understand that typically there is no limit on the number of items or terms in any combination, unless otherwise apparent from the context.

All of the compositions and/or methods disclosed and claimed herein can be made and executed without undue experimentation in light of the present disclosure. While the compositions and methods of this invention have been described in terms of preferred embodiments, it will be apparent to those of skill in the art that variations may be applied to the compositions and/or methods and in the steps or in the sequence of steps of the method described herein without departing from the concept, spirit and scope of the invention. All such similar substitutes and modifications apparent to those skilled in the art are deemed to be within the spirit, scope and concept of the invention as defined by the appended claims.

What is claimed is:

1. A ground plane and/or RF isolation structure on a substrate comprising: a photo-definable glass substrate having a top surface comprising an electronic device and a bottom surface, one or more through glass via (TGV) that extends from the top surface to the bottom surface of the photo-definable glass substrate; a top grounded metal on the top surface; a bottom grounded metal on the bottom surface; and a ground plane structure separated from the photo-definable glass substrate and electronically connected by the one or more TGV, wherein the top surface is connected to an electronic isolation structure on the bottom surface of the photo-definable glass substrate through a metallized filled TGV, wherein the electronic isolation structure on the bottom surface is a mirror image of the electronic device on the top surface of the photo-definable glass substrate.

2. The device of claim 1, wherein the photo-definable glass substrate is a photo-definable glass wafer.

3. The device of claim 1, further comprising a low resistive material that circumscribes at least part of the photo-definable glass substrate.

4. The device of claim 1, wherein the ground plane and/or RF isolation structure is electrically connected, mechanically connected or both to the ground plane structure.

5. The device of claim 4, wherein the electrical and mechanical connection is a solder bump.

6. The device of claim 1, wherein the photo-definable glass substrate comprises: 60-76 weight % silica, 6 weight %-16 weight % of a combination of $K_2O$ and $Na_2O$ with at least 3 weight % $K_2O$, 0.001-1 weight % $Ag_2O$, 0.75 weight %-7 weight % $B_2O_3$, and 5-8 weight % $Al_2O_3$, wherein the combination of $B_2O_3$, and $Al_2O_3$ not exceeding 13 weight %, 8-15 weight % $Li_2O$, and 0.04-0.1 weight % $CeO_2$.

7. The device of claim 1, wherein the ground plane and/or RF isolation structure comprises of an inductors, antenna, resistors, capacitors, transmission lines or transformer.

8. A method of creating a device created in or on photo-definable glass comprising the steps of: providing a photo-definable glass substrate; masking a design layout on the photo-definable glass substrate to form a masked design layout for one or more electrical conduction paths; exposing at least one portion of the masked design layout to an activating energy source; exposing the photo-definable glass substrate to a heating phase for at least ten minutes above its glass transition temperature to form an exposed glass substrate; transforming at least part of the exposed glass substrate to a crystalline material to form a glass-crystalline substrate; etching the glass-crystalline substrate with an etchant solution to form the one or more angled channels; converting the glass-crystalline substrate adjacent to the one or more angled channels to a ceramic phase; coating the one or more angled channels with one or more metals; coating at least a portion of the electrical isolation structure with a metallic media; and connecting the metallic media, the one or more metals or both to a circuitry through a surface or buried contact.

9. The method of claim 8, wherein the one or more metals may reside partially through, fully through, or on top of the glass-ceramic material or a combination thereof.

10. The method of claim 8, wherein the photo-definable glass substrate comprises: 60-76 weight % silica, 6 weight %-16 weight % of a combination of $K_2O$ and $Na_2O$ with at least 3 weight % $K_2O$, 0.001-1 weight % $Ag_2O$, 0.75 weight %-7 weight % $B_2O_3$, and 5-8 weight % $Al_2O_3$, wherein the combination of $B_2O_3$, and $Al_2O_3$ not exceeding 13 weight %, 8-15 weight % $Li_2O$, and 0.04-0.1 weight % $CeO_2$.

11. The method of claim 8, wherein the photo-definable glass substrate is essentially germanium-free.

12. The method of claim 8, wherein the photo-definable glass substrate comprises at least 0.5 weight % $B_2O_3$.

13. The method of claim 8, wherein the photo-definable glass substrate comprises at least 1.25 weight % $B_2O_3$.

14. The method of claim 8, wherein the photo-definable glass substrate comprises at least 0.3 weight % $Sb_2O_3$ or $As_2O_3$.

15. The method of claim 8, wherein the photo-definable glass substrate comprises 0.003-1 weight % $Au_2O$.

16. The method of claim 8, wherein the photo-definable glass substrate comprises 1-18 10 weight % of an oxide selected from the group consisting of CaO, ZnO, PbO, MgO and BaO.

17. The method of claim 8, wherein an anisotropic-etch ratio of exposed portion to said unexposed portion is at least one of 10-20:1; 21-29:1; 30-45:1; 20-40:1; 41-45:1; and 30-50:1.

18. The method of claim 8, wherein the activating energy source comprises an ultraviolet light having a wavelength of about 308-312 nm.

* * * * *